United States Patent
Li et al.

(10) Patent No.: US 11,788,956 B2
(45) Date of Patent: Oct. 17, 2023

(54) TERAHERTZ SPECTRUM MEASUREMENT SYSTEM AND METHOD FOR ANALYZING A TERAHERTZ SPECTRUM OF A SUBSTANCE

(71) Applicant: Shanghai Institute of Microsystem and Information Technology, Chinese Academy of Sciences, Shanghai (CN)

(72) Inventors: Hua Li, Shanghai (CN); Ziping Li, Shanghai (CN); Wenjian Wan, Shanghai (CN); Juncheng Cao, Shanghai (CN)

(73) Assignee: Shanghai Institute of Microsystem and Information Technology, Chinese Academy of Sciences, Shanghai (CN)

( * ) Notice: Subject to any disclaimer, the term of this patent is extended or adjusted under 35 U.S.C. 154(b) by 114 days.

(21) Appl. No.: 17/603,524

(22) PCT Filed: Sep. 30, 2019

(86) PCT No.: PCT/CN2019/109380
§ 371 (c)(1),
(2) Date: Oct. 13, 2021

(87) PCT Pub. No.: WO2020/220577
PCT Pub. Date: Nov. 5, 2020

(65) Prior Publication Data
US 2022/0221400 A1     Jul. 14, 2022

(30) Foreign Application Priority Data

Apr. 28, 2019  (CN) .......................... 201910350476.0

(51) Int. Cl.
*G01N 21/3581* (2014.01)
*G01N 21/01* (2006.01)
(Continued)

(52) U.S. Cl.
CPC ......... *G01N 21/3581* (2013.01); *G01N 21/01* (2013.01); *H01S 5/042* (2013.01);
(Continued)

(58) Field of Classification Search
CPC ............... G01N 21/3581; G01N 21/01; G01N 2021/0112; G01N 2021/396;
(Continued)

(56) References Cited

U.S. PATENT DOCUMENTS

| 2008/0137093 | A1 | 6/2008 | Kang et al. | |
|---|---|---|---|---|
| 2012/0120972 | A1* | 5/2012 | Belenky | B82Y 20/00 372/45.01 |
| 2016/0100476 | A1* | 4/2016 | Hur | G02F 2/02 250/504 R |

FOREIGN PATENT DOCUMENTS

| CN | 103344623 A | 10/2013 |
|---|---|---|
| CN | 104316186 A | 1/2015 |

(Continued)

*Primary Examiner* — Kiho Kim
(74) *Attorney, Agent, or Firm* — Boyle Fredrickson, S.C.

(57) ABSTRACT

The present application provides a terahertz spectrum measurement system and a method for analyzing a terahertz spectrum of a substance, wherein the terahertz spectrum measurement system comprises: two terahertz quantum cascade lasers with their emission ports arranged oppositely; and a vacuum hood arranged between the emission ports of two terahertz quantum cascade lasers. The terahertz spectrum measurement system and the method for analyzing a terahertz spectrum of a substance realize a separate terahertz dual frequency comb while retaining the advantages of the on-chip dual frequency comb system, which solves the problem that the on-chip dual frequency comb cannot directly measure the terahertz spectra of substances.

9 Claims, 2 Drawing Sheets

(51) Int. Cl.
- *H01S 5/042* (2006.01)
- *H01S 5/34* (2006.01)
- *G01N 21/39* (2006.01)

(52) U.S. Cl.
CPC .... *H01S 5/3402* (2013.01); *G01N 2021/0112* (2013.01); *G01N 2021/396* (2013.01); *G01N 2201/06113* (2013.01)

(58) Field of Classification Search
CPC ......... G01N 2201/06113; G01N 21/39; G01N 2021/3129; H01S 5/042; H01S 5/3402; H01S 5/02315; H01S 5/0623; H01S 2302/02; H01S 5/4031

See application file for complete search history.

(56) References Cited

FOREIGN PATENT DOCUMENTS

| | | | |
|---|---|---|---|
| CN | 108023272 A | * | 5/2018 |
| CN | 108023272 A | | 5/2018 |
| CN | 109445226 A | | 3/2019 |
| CN | 109462140 A | | 3/2019 |
| CN | 110132884 A | | 8/2019 |

* cited by examiner

TERAHERTZ SPECTRUM MEASUREMENT SYSTEM AND METHOD FOR ANALYZING A TERAHERTZ SPECTRUM OF A SUBSTANCE

This application is a national application of international PCT/CN2019/109380, filed on Sep. 30, 2019, which claims priority to Chinese patent application 201910350476.0, filed on Apr. 28, 2019, the contents of each of which are hereby incorporated by reference.

BACKGROUND OF THE INVENTION

1. Field of the Invention

The present application belongs to the field of terahertz spectrum analysis, and in particular relates to a terahertz spectrum measurement system and a method for analyzing a terahertz spectrum of a substance.

2. Related Art

The terahertz spectrum measurement system is an optical terahertz spectrum measurement system with a broadband coherent light source composed of a series of frequency lines with equal intervals and high stability shown in the frequency domain, the output of whose mode-locked laser is a periodical pulse sequence in the time domain and the equal frequency interval in the frequency domain of which is obtained by means of Fourier transform directed to the periodical pulses. The spectral coverage of the frequency comb is composed of a series of narrow lines, which solves the problems that the traditional harmonic frequency chain system is too complex, is too large in volume and can only measure one frequency. The stable frequency comb characteristics and broadband characteristics of the optical terahertz spectrum measurement system greatly promotes the development of the field of exact science, and leads to the advantages of high resolution, high sensitivity and real-time high speed in fine spectral detection compared with the traditional measurement equipments such as Fourier spectrometers. The spectra of two frequency combs overlap, but the repetition frequencies of the two frequency combs are slightly different, so that the mutual beat frequency of the two adjacent modes is converted downward to the microwave band to form a dual frequency comb. Compared with the traditional Fourier spectrometer, the dual frequency comb system can achieve fast and high-resolution spectra without moving any system component.

Although the dual frequency comb has been implemented in middle infrared and near infrared bands, in order to meet the application requirements of various spectral coverage, there is still rather necessary realistic demand for coherent frequency combs of other wavelengths, especially in terahertz (THz) band. Many gases and chemicals are unique in their "fingerprint spectra" in THz band, and thus it is of great significance to develop THz dual frequency combs for the practical application such as gas tracking, toxic substance detection and so on. However, the THz frequency comb based on photoconductive antenna or nonlinear crystal has a huge and complex structure, so it needs femtosecond laser pumping and is too low in its THz power, which cannot meet the practical application of a THz dual frequency comb. Electrically pumped terahertz quantum cascade lasers (THz QCLs) are ideal light sources for developing a THz frequency comb because of their compact structure and high output power.

Although the on-chip terahertz dual frequency comb system has been developed, it cannot be directly used to detect the terahertz spectrum of a substance due to the defects of its system structure, and there is still a long way from practical application. In addition, once the production of the on-chip dual frequency comb system is completed, the coupling efficiency between the two frequency combs will be fixed and cannot be tuned.

SUMMARY OF THE INVENTION

The purpose according to the present application is to provide a terahertz spectrum measurement system and a method for analyzing a terahertz spectrum of a substance, so as to measure a terahertz spectrum of a substance directly.

In order to solve the above technical problems, the technical solution of the present application is to provide a terahertz spectrum measurement system, comprising: two terahertz quantum cascade lasers with their emission ports arranged oppositely; and a vacuum hood, which is arranged between the emission ports of the two terahertz quantum cascade lasers.

Optionally, the terahertz spectrum measurement system further comprises: radio frequency sources, each of which is connected to the terahertz quantum cascade laser to provide a high-frequency RF signal for the terahertz quantum cascade laser; and DC sources, each of which is connected to the terahertz quantum cascade laser to provide a DC bias for the terahertz quantum cascade laser.

Optionally, the terahertz spectrum measurement system further comprises: T-type bias tees, each of which is arranged among the RF source, the DC source and the terahertz quantum cascade laser, for injecting the high-frequency RF signal and the DC bias into the terahertz quantum cascade laser.

Optionally, the T-type bias tee is connected to the upper electrode of the terahertz quantum cascade laser via a microstrip line.

Optionally, the numbers of the RF sources, DC sources and T-type bias tees are each two, and each terahertz quantum cascade laser is correspondingly connected with a T-type bias tee, an RF source and a DC source.

Optionally, the T-type bias tee comprises a DC bias port and an RF port, the DC source is connected to the DC bias port, and the RF source is connected to the RF port.

Optionally, the terahertz spectrum measurement system further comprises: circulators, each of which is arranged between the RF source and the RF port to connect the RF source and the RF port.

Optionally, the terahertz spectrum measurement system further comprises: spectrum analyzers, each of which is connected to the RF port to display a beat frequency signal of the terahertz quantum cascade laser and provide reference frequency for the RF provided by the RF source.

Optionally, the terahertz spectrum measurement system further comprises: low noise amplifiers, each of which is arranged between the RF port and the spectrum analyzer, and is connected with the RF port and the spectrum analyzer, for amplifying the signals from the RF port to the spectrum analyzer.

Optionally, the terahertz spectrum measurement system further comprises: a mounting frame in Y-shape, wherein the two terahertz quantum cascade lasers are respectively arranged on surfaces of both side arms of the mounting frame, and the positions of the terahertz quantum cascade lasers are adjustable when they are installed on surfaces of side arms of the mounting frame.

Optionally, the laser emission directions of the two terahertz quantum cascade lasers intersect, and the included angles from the laser emission directions of the two terahertz quantum cascade lasers to the horizontal plane are different when the mounting frame is placed horizontally.

In order to solve the above technical problems, another technical solution of the present application is to provide a method for analyzing a terahertz spectrum of a substance, which comprises the following steps: placing a substance to be analyzed between the two terahertz quantum cascade lasers; obtaining a dual frequency comb spectrum of the substance to be analyzed by emitting terahertz quantum lasers towards the substance to be analyzed via the two terahertz quantum cascade lasers; obtaining the terahertz spectrum of the substance to be analyzed by comparing the dual frequency comb spectrum of the substance to be analyzed with a terahertz spectrum.

Optionally, the method for analyzing a terahertz spectrum of a substance further comprises the following steps: calibrating the comparison relationship between the dual frequency comb generated by the two terahertz quantum cascade lasers and the terahertz spectrum.

Optionally, calibrating the comparison relationship between the dual frequency comb generated by the two terahertz quantum cascade lasers and the terahertz spectrum comprises the following steps: placing water vapor between the two terahertz quantum cascade lasers; obtaining a dual frequency comb spectrum of water vapor by emitting terahertz quantum lasers towards water vapor via the two terahertz quantum cascade lasers; comparing it with the standard dual frequency comb spectrum of water vapor to make a calibration.

Optionally, the terahertz quantum lasers emitted by the two terahertz quantum cascade lasers intersect and are in a weakly coupled state.

The terahertz spectrum measurement system and the method for analyzing a terahertz spectrum of a substance apply the RF injection modulation technology to the terahertz quantum cascade lasers to realize a broadband terahertz dual frequency comb without a detector. The frequency comb of a terahertz quantum cascade laser is used as a detector to realize a highly integrated dual frequency comb system, so that a terahertz spectrum of a substance can be directly measured, the coupling efficiency of the dual frequency comb can be changed, and the dual frequency comb system can be tuned.

Further, since the two terahertz quantum cascade lasers are lasing face-to-face, the coupling efficiency of the dual frequency comb can be changed by adjusting the position and lasing angle of the two terahertz quantum cascade lasers during installation, which can not only avoid the injection locking and inability to generate a dual frequency comb between the two terahertz frequency combs resulting from the high coupling rate, but also make the dual frequency comb system tunable and make its coupling efficiency be able to be changed continuously as needed in the using process.

Further, the vacuum hood specially designed and manufactured by the present invention adopts high-density polyethylene (HDPE) material which has high transmittance in terahertz band; and the space between two terahertz quantum cascade lasers is used to place a substance to be measured, which also enables the incident terahertz quantum lasers emitted by the terahertz quantum cascade lasers to be unchanged after passing through the vacuum hood under the condition of high vacuum.

BRIEF DESCRIPTION OF THE DRAWINGS

These and other features and advantages of this application will become more apparent to those skilled in the art from the detailed description of preferred embodiment. The drawings that accompany the description are described below.

Wherein.

DESCRIPTION OF THE PREFERRED EMBODIMENTS

The followings are used to further illustrate the terahertz spectrum measurement system of the present application with specific embodiments. It should be understood that the following embodiments is only used to explain the present application but not to limit the scope of the present application.

Figure 1:
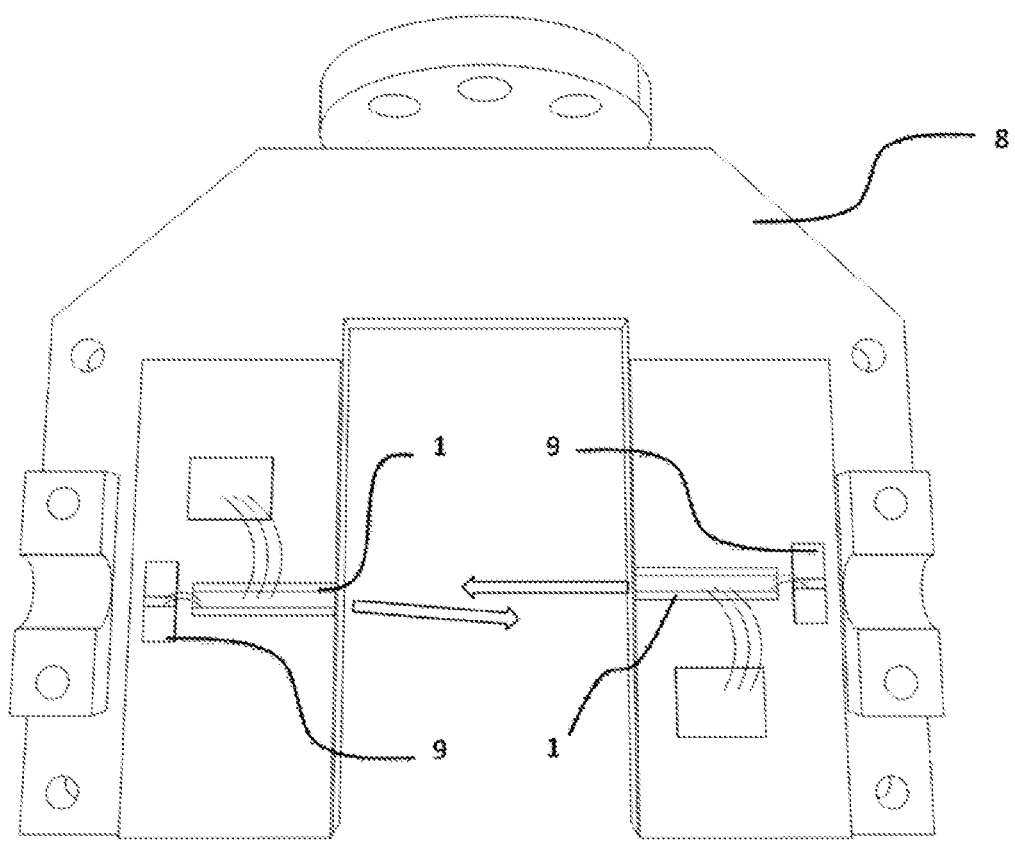
FIG. 1 is a structural schematic view of a terahertz spectrum measurement system in one embodiment of the present application.
Figure 2:
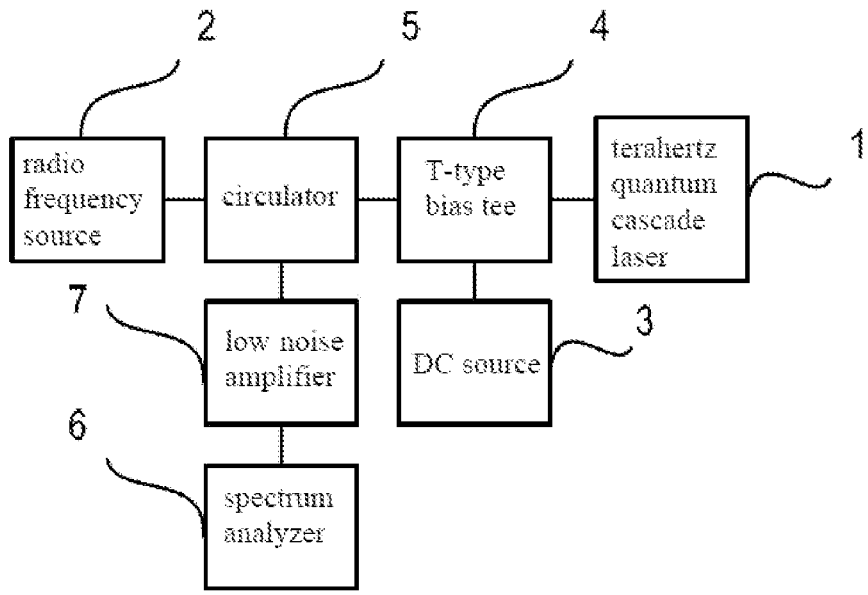
FIG. 2 is a schematic view of the connection relationship of a terahertz quantum cascade laser of the terahertz spectrum measurement system in one embodiment of the present application.

Please refer to FIGS. 1 and 2, wherein FIG. 1 is a structural schematic view of a terahertz spectrum measurement system in one embodiment of the present application, and FIG. 2 is a schematic view of the connection relationship of a terahertz quantum cascade laser of the terahertz spectrum measurement system in one embodiment of the present invention.

In one embodiment, a terahertz spectrum measurement system is provided, which comprises: two terahertz quantum cascade lasers 1 with their emission ports arranged oppositely; and a vacuum hood, which is arranged between the emission ports of the two terahertz quantum cascade lasers 1.

In one embodiment, the terahertz quantum cascade lasers 1 are semiconductor lasers, the emission ports of the two terahertz quantum cascade lasers 1 are arranged oppositely, and their lasing surfaces are opposite. The two terahertz quantum cascade lasers 1 are not on the same straight line by adjusting their specific positions, and thus there is also an angle difference and non parallelism between the terahertz quantum lasers emitted by the two terahertz quantum cascade lasers 1, which makes the two terahertz quantum cascade lasers 1 be always in a weakly coupled state and do not lock each other, so that the spectra of terahertz quantum lasers emitted by two terahertz quantum cascade lasers 1 are different and a dual frequency comb is generated accordingly.

In one embodiment, the difference of the distances from the same points on the two terahertz quantum cascade lasers to the same straight line is 1-5 mm; and the angle difference between the terahertz quantum lasers emitted by the two terahertz quantum cascade lasers 1 is 0-5 degrees.

In fact, the distance between the emission ports of the two terahertz quantum cascade lasers and the angle difference between the terahertz lasers emitted by the two terahertz quantum cascade lasers 1 can be changed as needed, as long as it is guaranteed that the actual power injected by one terahertz quantum cascade laser 1 into the other terahertz quantum cascade laser 1 is less than a preset threshold, and the two terahertz quantum cascade lasers 1 do not lock each other. In one embodiment, the distance between the emission ports of the two terahertz quantum cascade lasers is in the adjustment range of 10-50 mm, and the angle difference between them is in the adjustment range of 0-5 degrees.

In one embodiment, the resonant cavity size, material of the gain medium and waveguide structure of the two terahertz quantum cascade lasers 1 are exactly the same. Specifically, the resonant cavity is in the length of 2-15 mm, and is in the width of 50-300 um, the distance between the emission ports of the two terahertz quantum cascade lasers 1 is 10-50 mm, the gain bandwidth of the gain medium is greater than 100 GHz, and the microstrip lines 9 that can work at a ultra-low temperature for impedance matching are placed at the distance of 2-5 mm from the rear end surface of the terahertz quantum cascade lasers 1.

In one embodiment, the terahertz spectrum measurement system further comprises: radio frequency sources 2, each of which is connected to the terahertz quantum cascade laser 1 to provide a high-frequency RF signal for the terahertz quantum cascade laser 1; and DC sources 3, each of which is connected to the terahertz quantum cascade laser 1 to provide a DC bias for the terahertz quantum cascade laser 1.

In one embodiment, the DC biases applied to the two terahertz quantum cascade lasers 1 are not exactly the same because applying different voltage biases can change the spectrum ranges of the terahertz quantum cascade lasers 1 according to the characteristics of the gain media of terahertz quantum cascade lasers 1. In this way, it can be ensured that although the spectra of the two terahertz quantum cascade lasers 1 overlap, their frequency points are not exactly the same. The voltage bias applied to a laser varies depending on the gain media of the laser, but it is necessary to ensure that the laser has a laser lasing under a certain voltage bias, that is, the voltage should be above the threshold voltage. Due to the Stark effect of the gain medium of terahertz quantum cascade laser 1, that is to say, the spectrum will have a blue shift (that is, the wavelength becomes shorter and the frequency becomes higher) with an increase in the bias voltage, applying different voltages to the two terahertz quantum cascade lasers 1 ensures the slight difference between the spectra of the two terahertz quantum cascade lasers 1 by making use of the blue shift of their frequency.

In one embodiment, the terahertz spectrum measurement system further comprises: T-type bias tees 4, each of which is arranged among the RF source 2, the DC source 3 and the terahertz quantum cascade laser 1, for injecting the high-frequency RF signal and the DC bias into the terahertz quantum cascade laser 1.

In one embodiment, the T-type bias tees 4 are connected to the upper electrodes of the terahertz quantum cascade lasers 1 via microstrip lines 9.

In this embodiment, the microstrip lines 9 are microstrip lines 9 that can work at a low temperature. Because the terahertz spectrum measurement system generally works in an ultra-low temperature environment (less than 40 K), the low loss and effective transmission of high-frequency signals at an ultra-low temperature is particularly important. Setting microstrip lines 9 that can work at a low temperature can meet the needs of the transmission of low-temperature and high-frequency signals, so as to realize the impedance matching between the coaxial cable and the terahertz optical comb, and thus to reduce the loss of high-frequency signals.

In one embodiment, the numbers of the RF sources 2, DC sources 3 and T-type bias tees 4 are each two, and each terahertz quantum cascade laser 1 is correspondingly connected with a T-type bias tee 4, an RF source 2 and a DC source 3.

In one embodiment, two RF sources 2 inject low-power RF signals into the two terahertz quantum cascade lasers 1 respectively at the same time. It should be noted that the frequencies of the injected RF signals are close to the cavity round-trip frequencies of the two terahertz quantum cascade lasers 1 (that is, the repetition frequencies of the lasing terahertz quantum laser), but it is not exactly equal. The spectra of the two terahertz quantum cascade lasers 1 modulated by RF injection will form a mutual beat frequency to generate the down conversion spectrum of the microwave band, so that a dual frequency comb will be seen on the spectrum analyzer 6.

In one embodiment, the T-type bias tee 4 comprises a DC bias port and an RF port, the DC source 3 is connected to the DC bias port, and the RF source 2 is connected to the RF port. Specifically, the DC source 3 is connected to the DC bias port via a BNC cable, and the RF source 2 is connected to the RF port via a high-frequency coaxial cable.

In one embodiment, the output of the DC source 3 is divided into two channels, wherein, one is loaded to the microstrip line via the T-type bias tee 4 and the microstrip line is connected with the upper electrode of the terahertz quantum cascade laser 1 via a gold lead wire, and the other is directly loaded on the ceramic chip which is connected with the upper electrode of the terahertz quantum cascade laser 1 via a gold lead wire. It should be noted that it is the positive electrode of the DC source 3 that is connected to the ceramic chip or the T-type bias 4, and the negative electrode of the DC source 3 is connected to the lower electrode of the terahertz quantum cascade laser 1.

In one embodiment, the T-type bias tee 4 further comprises a mixing port, which is connected to the microstrip line 9 connected with the upper electrode of the terahertz quantum cascade laser 1 via a high-frequency coaxial cable. In this embodiment, the microstrip line 9 is also connected to the upper electrode of the terahertz quantum cascade laser 1 via a gold lead wire.

In one embodiment, the terahertz spectrum measurement system further comprises circulators 5, each of which is arranged between the RF source 2 and the RF port to connect the RF source 2 and the RF port. The circulator 5 prevents signals extracted from the terahertz quantum cascade laser 1 and signals transmitted by the RF source 2 from generating interference. In this embodiment, the RF source 2 is connected to the circulator 5 via a high-frequency coaxial cable, and the circulator 5 is connected to the RF port through a high-frequency coaxial cable.

In one embodiment, the number of circulators 5 is also two, and the circulators 5 are respectively connected to different terahertz quantum cascade lasers 1.

In one embodiment, the terahertz spectrum measurement system further comprises: spectrum analyzers 6, each of which is connected to the RF port to display the beat frequency signal of the terahertz quantum cascade laser 1 and provide reference frequency for the RF provided by the RF source 2.

In one embodiment, the terahertz spectrum measurement system further comprises: low noise amplifiers 7, each of which is arranged between the RF port and the spectrum analyzer 6, and is connected with the RF port and the spectrum analyzer 6, for amplifying the signals from the RF port to the spectrum analyzer 6.

In this specific embodiment, the devices connected with the three ports of the circulator 5 according to its one-way communication direction are an RF source 2, an RF port and a low noise amplifier 7 in sequence.

In one embodiment, the terahertz spectrum measurement system further comprises: a mounting frame 8 in Y-shape, wherein the two terahertz quantum cascade lasers 1 are respectively arranged on surfaces of both side arms of the mounting frame 8, and the positions of the terahertz quantum cascade lasers 1 are adjustable when they are installed on surfaces of side arms of the mounting frame 8.

In one embodiment, the mounting frame 8 is a copper-based gold-plated material. In fact, the specific material of the mounting frame 8 can be set as needed.

In one embodiment, the surfaces of side arms of the mounting frame 8 are provided with mounting members for terahertz quantum cascade lasers 1, which can fix the terahertz quantum cascade lasers 1 on the surfaces of side arms. In one embodiment, the mounting members for a terahertz quantum cascade laser 1 comprise a movable fastener and a movable shaft arranged at the lower end of the movable fastener. The position of the terahertz quantum cascade laser 1 and its angle relative to the horizontal plane can be changed by changing the position of the movable shaft at the lower end of the movable fastener relative to the surface of side arm and its angle relative to the horizontal plane.

In one embodiment, the vacuum hood is made of high-density polyethylene (HDPE) material which has high transmittance in terahertz band, and the loss of the terahertz quantum lasers after passing through the vacuum hood is very small, which has little impact on the final measurement results. In fact, other materials can also be selected as needed to produce a vacuum hood, as long as them ensure high transmittance in terahertz band.

In one embodiment, the vacuum hood also thickens the hood wall, and optimizes the air gap distance and the corner structure.

Figure 3:
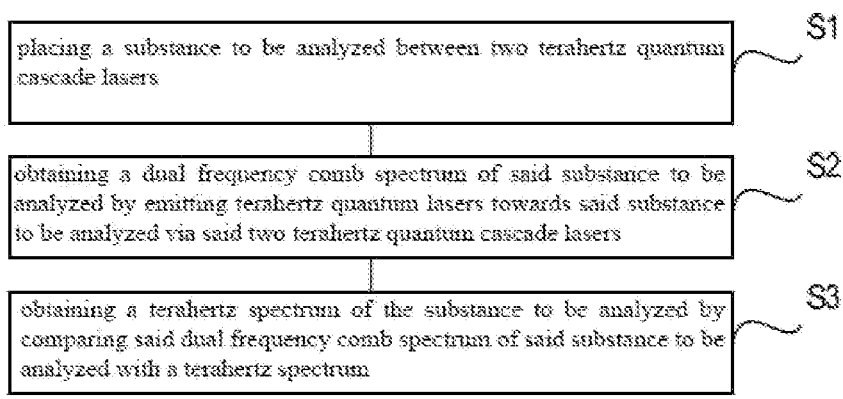
FIG. 3 is a flow diagram of a method for analyzing a terahertz spectrum of a substance in one embodiment of the present application.

FIG. 3 is a flow diagram of a method for analyzing a terahertz spectrum of a substance in one embodiment of the present application. In this embodiment, a method for analyzing the terahertz spectrum of a substance is provided, comprising the following steps: S1: placing a substance to be analyzed between two terahertz quantum cascade lasers 1; S2: obtaining a dual frequency comb spectrum of the substance to be analyzed by emitting terahertz quantum lasers towards the substance to be analyzed via the two terahertz quantum cascade lasers 1; S3: obtaining the terahertz spectrum of the substance to be analyzed by comparing the dual frequency comb spectrum of the substance to be analyzed with a terahertz spectrum.

In one embodiment, the method for analyzing a terahertz spectrum of a substance further comprises the following steps: calibrating the comparison relationship between the dual frequency comb generated by the two terahertz quantum cascade lasers 1 and the terahertz spectrum.

In one embodiment, calibrating the comparison relationship between the dual frequency comb generated by the two terahertz quantum cascade lasers 1 and the terahertz spectrum comprises the following steps: placing water vapor between the two terahertz quantum cascade lasers 1; obtaining a dual frequency comb spectrum of water vapor by emitting terahertz quantum lasers towards water vapor via the two terahertz quantum cascade lasers 1; comparing it with the standard dual frequency comb spectrum of water vapor to make a calibration.

In one embodiment, the terahertz quantum lasers emitted by the two terahertz quantum cascade lasers 1 intersect and are in a weakly coupled state.

In this specific embodiment, because the terahertz spectrum of water vapor is known, the calibration of the relationship between the dual frequency comb spectrum and the terahertz spectrum can be completed by measuring the dual frequency comb absorption spectrum of water vapor. Water vapor has an obvious absorption peak in terahertz band, and the absorption peak is known. For example, 4.2 THz is the position of the absorption peak of water vapor. Firstly, measure the dual frequency comb spectrum of water vapor. If there is an absorption peak at F1, F1 in the dual frequency comb will correspond to 4.2 THz in terahertz spectrum, since there is only one water vapor absorption peak within its spectral coverage, such as the peak at 4.2 THz, according to the spectrum of the terahertz quantum cascade laser 1 in terahertz band. Then, according to the repetition frequency, each comb teeth in the dual frequency comb can correspond to frequency points in the terahertz spectrum respectively, which completes the calibration of the relationship between the dual frequency comb spectrum and the terahertz spectrum.

The terahertz spectrum measurement system and the method for analyzing a terahertz spectrum of a substance apply the RF injection modulation technology to the terahertz quantum cascade laser to realize a broadband terahertz dual frequency comb without a detector. The frequency comb of a terahertz quantum cascade laser is used as a detector to realize a highly integrated dual frequency comb system, so that a terahertz spectrum of a substance can be directly measured, the coupling efficiency of the dual frequency comb can be changed, and the dual frequency comb system can be tuned.

Further, since the two terahertz quantum cascade lasers are lasing face-to-face, the coupling efficiency of the dual frequency comb can be changed by adjusting the position and lasing angle of the two terahertz quantum cascade lasers during installation, which can not only avoid the injection locking and inability to generate a dual frequency comb between the two terahertz frequency combs resulting from the high coupling rate, but also make the dual frequency comb system tunable and make its coupling efficiency be able to be changed continuously as needed in the using process.

Further, the vacuum hood specially designed and manufactured by the present invention adopts high-density polyethylene (HDPE) material which has high transmittance in terahertz band; and the space between two terahertz quantum cascade lasers is used to place a substance to be measured, which also enables the incident terahertz quantum laser emitted by the terahertz quantum cascade lasers to be unchanged after passing through the vacuum hood under the condition of high vacuum.

The foregoing application has been described in accordance with the relevant legal standard, thus the description is exemplary rather than limiting in nature. Variations and modifications to the disclosed embodiment may become apparent to those skilled in the art and do come within the scope of the application. Accordingly, the scope of legal protection afforded this application can only be determined by studying the following claims.

What is claimed is:

1. A terahertz spectrum measurement system, comprising:
   two terahertz quantum cascade lasers with their emission ports arranged oppositely;
   a vacuum hood, which is arranged between emission ports of two terahertz quantum cascade laser devices;

radio frequency sources, each of which is connected said terahertz quantum cascade laser to provide a high-frequency RF signal for said terahertz quantum cascade laser;

DC sources, each of which is connected to said terahertz quantum cascade laser to provide a DC bias for said terahertz quantum cascade laser; and T-type bias tees, each of which is arranged among said RF source, said DC source and said terahertz quantum cascade laser for injecting said high-frequency RF signal and said DC bias into aid terahertz quantum cascade laser;

wherein numbers of said RF sources, said DC sources and said T-type bias tees are each two, and each terahertz quantum cascade laser is correspondingly connected with a T-type bias tee, and RF source and a DC source.

2. The terahertz spectrum measurement system according to claim 1, wherein said T-type bias tee is connected to an upper electrode of said terahertz quantum cascade laser via a microstrip line.

3. The terahertz spectrum measurement system according to claim 1, wherein said T-type bias tee comprises a DC bias port and an RF port, said DC source is connected to said DC bias port, and said RF source is connected to said RF port.

4. The terahertz spectrum measurement system according to claim 3, further comprising a plurality of circulators, each of which is arranged between said RF source and said RF port to connect said RF source and said RF port.

5. A terahertz spectrum measurement system, comprising:
two terahertz quantum cascade lasers with their emission ports arranged oppositely;
a vacuum hood, which is arranged between emission ports of two terahertz quantum cascade laser devices;
radio frequency sources, each of which is connected to said terahertz quantum cascade laser to provide a high-frequency RF signal for said terahertz quantum cascade laser;
DC sources, each of which is connected to said terahertz quantum cascade laser to provide a DC bias for said terahertz quantum cascade laser;
T-type bias tees, each of which is arranged among said RF source, said DC source and said terahertz quantum cascade laser for injecting said high-frequency RF signal and said DC bias into said terahertz quantum cascade laser;
a plurality of spectrum analyzers, each of which is connected to said RF port to display a beat frequency signal of said terahertz quantum cascade laser and provide reference frequency for RF provided by said RF source;
wherein said T-type bias tee comprises a DC bias port and an RF port, said DC source is connected to said DC bias port, and said RF source is connected to said RF port.

6. The terahertz spectrum measurement system according to claim 5, further comprising:
a plurality of low noise amplifiers, each of which is arranged between said RF port and said spectrum analyzer, and is connected with said RF port and said spectrum analyzer, for amplifying signals from said RF port to said spectrum analyzer.

7. The terahertz spectrum measurement system according to claim 5, further comprising a plurality of circulators, each of which is arranged between said RF source and said RF port to connect said RF source and said RF port.

8. A terahertz spectrum measurement system, comprising:
two terahertz quantum cascade lasers with their emission ports arranged oppositely; and
a vacuum hood, which is arranged between emission ports of two terahertz quantum cascade laser devices; and
a mounting frame in Y-shape, wherein said two terahertz quantum cascade lasers are respectively arranged on surfaces of both side arms of said mounting frame, and positions of said terahertz quantum cascade lasers are adjustable when they are installed on surfaces of side arms of said mounting frame.

9. The terahertz spectrum measurement system according to claim 8, wherein laser emission directions of two terahertz quantum cascade lasers intersect, and included angles from said laser emission directions of two terahertz quantum cascade lasers to a horizontal plane are different when said mounting frame is placed horizontally.

* * * * *